US006995388B2

(12) United States Patent
Hwang et al.

(10) Patent No.: US 6,995,388 B2
(45) Date of Patent: Feb. 7, 2006

(54) PHASE CHANGEABLE MEMORY DEVICES AND METHODS OF FORMING THE SAME IN WHICH AN UPPER ELECTRODE INCLUDES A TIP THAT EXTENDS TOWARD A LOWER ELECTRODE

(75) Inventors: Young-Nam Hwang, Gyeonggi-do (KR); Se-Ho Lee, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 15 days.

(21) Appl. No.: 10/695,553

(22) Filed: Oct. 28, 2003

(65) Prior Publication Data

US 2004/0085833 A1     May 6, 2004

(30) Foreign Application Priority Data

Nov. 1, 2002  (KR) .................... 10-2002-0067351

(51) Int. Cl.
*H01L 47/00*  (2006.01)
*H01L 21/00*  (2006.01)
(52) U.S. Cl. .................. 257/4; 257/200; 257/246; 438/93; 438/95; 438/398
(58) Field of Classification Search ............. 257/4, 257/200, 246; 438/93, 95, 398, 602
See application file for complete search history.

(56) References Cited

U.S. PATENT DOCUMENTS

| 6,117,720 A | 9/2000 | Harshfield | 438/238 |
| 6,507,061 B1 * | 1/2003 | Hudgens et al. | 257/295 |
| 6,566,700 B2 * | 5/2003 | Xu | 257/296 |
| 6,605,527 B2 * | 8/2003 | Dennison et al. | 438/618 |
| 6,764,894 B2 * | 7/2004 | Lowrey | 438/238 |

FOREIGN PATENT DOCUMENTS

KR    2004-32955    4/2004

OTHER PUBLICATIONS

Korean Office Action corresponding to Korean patent application 2002-67351, dated Aug. 25, 2004.

* cited by examiner

*Primary Examiner*—Hsien-Ming Lee
(74) *Attorney, Agent, or Firm*—Myers Bigel Sbiley & Sajovec, P.A.

(57) ABSTRACT

A phase changeable memory device includes a substrate having a lower electrode disposed thereon. A phase changeable pattern is disposed on the lower electrode and an upper electrode is disposed on the phase changeable pattern that has a tip that extends therefrom and is directed toward the lower electrode.

34 Claims, 9 Drawing Sheets

Fig. 1

(PRIOR ART)

Fig. 2

(PRIOR ART)

PHASE CHANGEABLE MEMORY DEVICES AND METHODS OF FORMING THE SAME IN WHICH AN UPPER ELECTRODE INCLUDES A TIP THAT EXTENDS TOWARD A LOWER ELECTRODE

RELATED APPLICATION

This application claims the benefit of Korean Patent Application No. 2002-67351, filed Nov. 1, 2002, the disclosure of which is hereby incorporated herein by reference.

FIELD OF THE INVENTION

The present invention relates to nonvolatile integrated circuit memory devices and method of forming the same, and, more particularly, nonvolatile phase changeable integrated circuit memory device and methods of forming the same.

BACKGROUND OF THE INVENTION

Generally, nonvolatile memory devices do not lose their stored data even though their power is turned off. These nonvolatile memory devices usually include flash memory cells that have a stacked gate structure. The stacked gate structure typically includes a tunnel oxide film, a floating gate, an inter-gate dielectric layer and a control gate electrode stacked sequentially. To improve reliability of the flash memory cell and efficiency of program, the quality of the tunnel oxide film may be improved and the coupling ratio of a cell may be increased.

Figure 1:
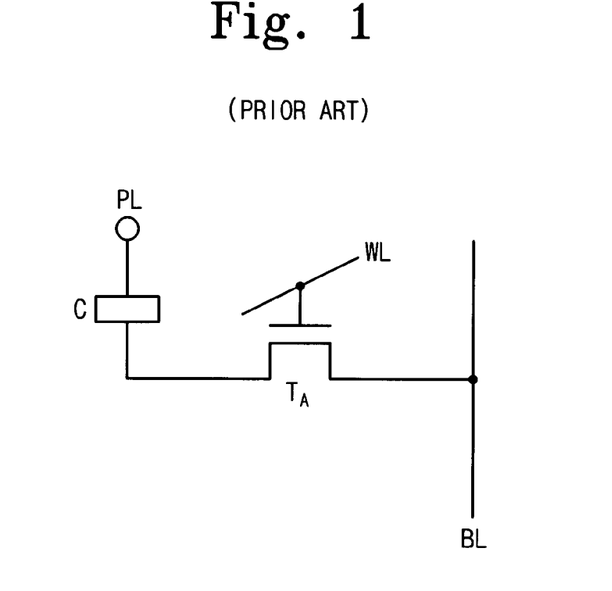
FIG. 1 illustrates an equivalent circuit of a unit cell of a conventional phase changeable memory device.

Some nonvolatile memory devices may use phase changeable memory devices instead of the flash memory devices. FIG. 1 illustrates an equivalent circuit of a unit cell of a conventional phase changeable memory device. Referring now to FIG. 1, the phase changeable memory cell includes an access transistor $T_A$ and a variable resistor C. The variable resistor C includes a lower electrode, an upper electrode, and a phase changeable material layer interposed between the lower electrode and the upper electrode. The upper electrode of the variable resistor C is connected to a plate electrode PL. In addition, the access transistor $T_A$ includes a source region connected to the lower electrode, a drain region spaced apart from the source region, and a gate electrode on a channel region between the source region and the drain region. The gate electrode and the drain region of the access transistor $T_A$ are connected to a word line WL and a bit line BL, respectively. Consequently, the equivalent circuit of the phase changeable memory cell is similar to an equivalent circuit of a DRAM cell. The phase changeable material film is different from that of a dielectric film used in a DRAM, however. More specifically, the phase changeable material film has two stable states according to temperature.

Figure 2:
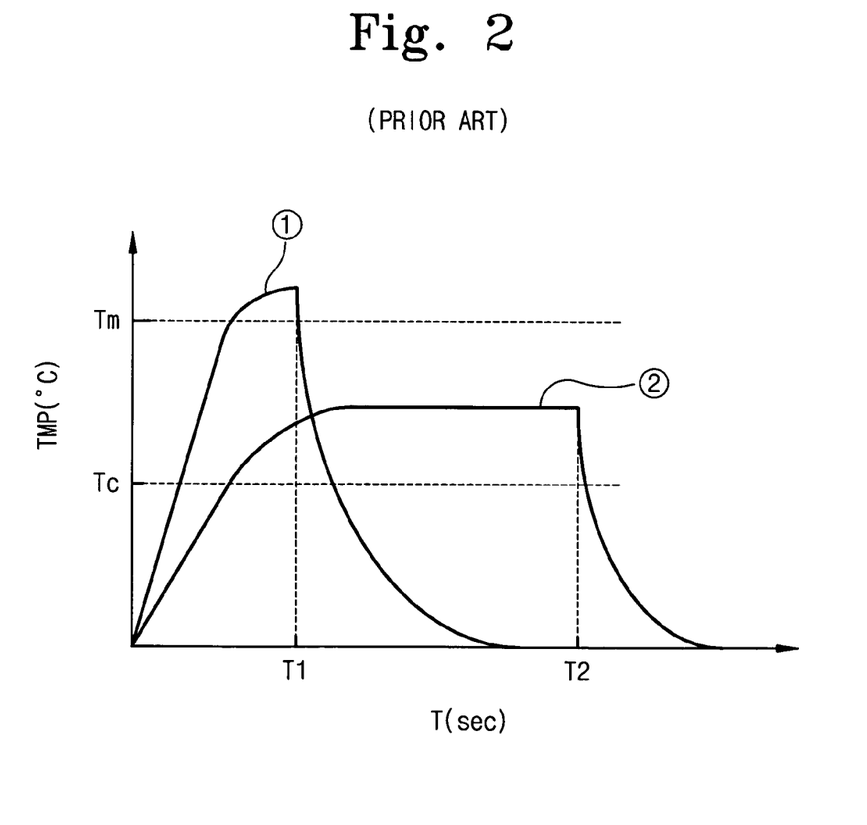
FIG. 2 is a graph that illustrates a method of programming and erasing the unit cell of FIG. 1.

FIG. 2 is a graph that illustrates a method of programming and erasing the phase changeable memory cell. Here, the horizontal axis corresponds to time T and the vertical axis corresponds to temperature TMP that is applied to the phase changeable material film. Referring now to FIG. 2, when the phase changeable material film is heated to a temperature higher than the melting temperature Tm during a first duration T1 and cooled, the phase changeable material film becomes amorphous (1). When the phase changeable material film is heated to a temperature higher than the crystallization temperature Tc but lower than the melting temperature Tm during a second duration T2 longer than the first duration and cooled, the phase changeable material film is crystallized (2). The specific resistance of the amorphous phase changeable material film is higher than that of the crystalline phase changeable material film. Accordingly, the current flowing through the phase changeable material film is detected during read mode so that it is determined whether the information stored in the phase changeable memory cell is logic "1" or "0." A compound material layer that includes germanium (Ge), tellurium (Te), and stibium (Sb) (hereafter, referred to as GTS) is usually used as the phase changeable material film.

A method of reducing contact area between an electrode and a phase changeable material to improve the efficiency of the phase changeable memory device is disclosed in U.S. Pat. No. 6,117,720 entitled "Method of Making an Integrated Circuit Electrode Having a Reduced Contact Area."

Figure 3:
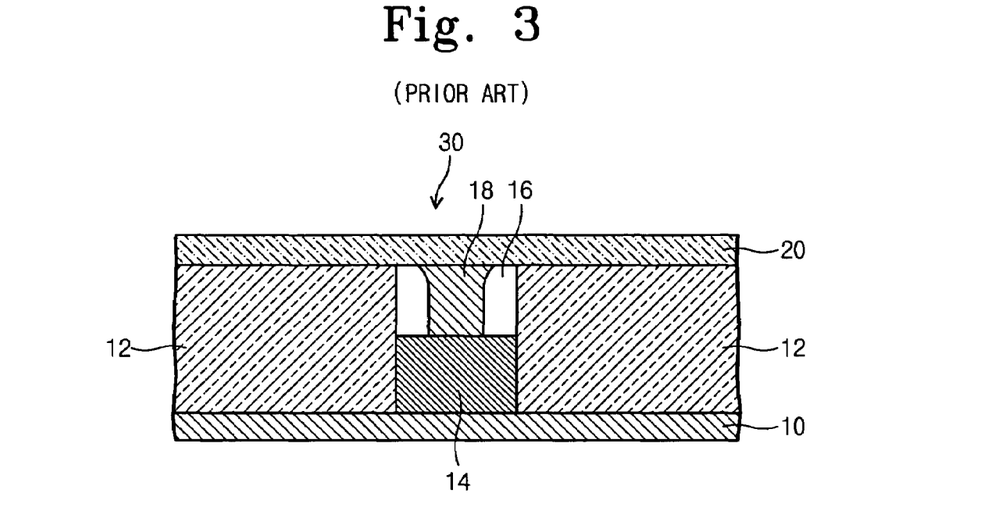
FIGS. 3–5 are cross-sectional views of a conventional phase changeable memory device.

FIG. 3 is a cross-sectional view of a conventional phase changeable memory device 30. The conventional phase changeable memory device 30 includes a lower electrode 10 formed on a semiconductor substrate and an interlayer insulating film 12 having openings on the lower electrode 10. The opening is provided with a plug 14 connected electrically to the lower electrode 10 therein. The opening on the plug 14 is provided with a spacer 16 on the sidewall of the opening. A contact portion 18 connected to the plug 14 is positioned on the area surrounded by the spacer 16. The contact portion 18 can be formed using a phase changeable material and/or a conductive material. If the contact portion 18 is formed using a phase changeable material, then an upper electrode 20 is disposed on the interlayer insulating film 12 and the contact portion 18. If the contact portion 18 is formed using a conductive material, then a phase changeable pattern is formed on the contact portion 18 and the upper electrode is formed on the phase changeable pattern.

Figure 4:
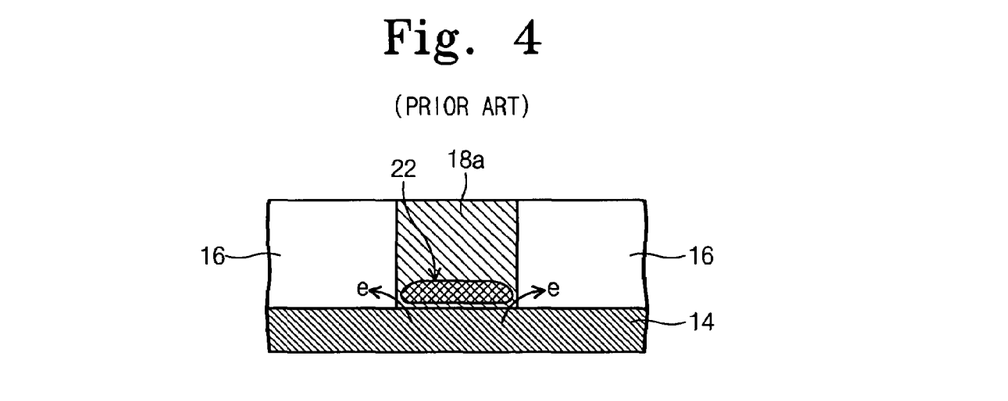
Figure 5:
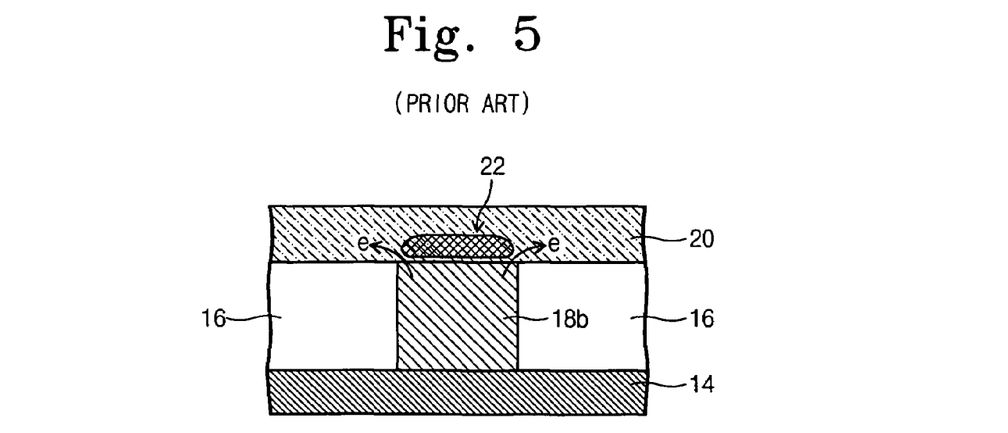

FIGS. 4 and 5 are cross-sectional views that illustrate aspects of the conventional phase changeable memory device 30. FIG. 4 illustrates an example in which the contact portion 18a is formed using a phase changeable material. When current is applied to the lower electrode (not shown), heat is generated due to resistance on the boundary surface between the plug 14 and the contact portion 18a. As a result, the state of the phase changeable material is changed. Because the plug 14 has relatively high heat conductivity, however, and the spacer 16 in contact with the contact portion 18a has a relatively low temperature, the edge of the contact portion 18a and the portion in contact with the plug 14 can experience a decrease in temperature. Consequently, when the phase changeable material layer becomes amorphous, the edge of the contact portion 18a may not become completely amorphous, which may result in current leakage.

FIG. 5 illustrates an example in which the contact portion 18a is formed using a conductive material. The phase changeable pattern 20 is formed on the contact portion 18b. As described with reference to FIG. 4, when current is applied to the lower electrode (not shown), the state of the area in contact with the contact portion 18b of the phase changeable pattern 20 changes. In this case, the heat of the area in contact with the contact portion 18b and the area in contact with the edge of the contact portion 18b is transmitted to surrounding portions, so that the state of the areas may be incompletely changed. Because a relatively large amount of current may be required to change the state of a phase changeable material layer completely, power consumption may increase and the data sensitivity may deteriorate.

SUMMARY OF THE INVENTION

According to some embodiments of the present invention, a phase changeable memory device comprises a substrate having a lower electrode disposed thereon. A phase changeable pattern is disposed on the lower electrode and an upper electrode is disposed on the phase changeable pattern that has a tip that extends therefrom and is directed toward the lower electrode.

In other embodiments of the present invention, an interlayer insulating film is disposed on the substrate and has an opening therein that exposes a portion of the lower electrode. The phase changeable pattern is formed in the opening and has a depression therein that is directed toward the lower electrode.

In still other embodiments of the present invention, spacers are disposed between opposing sidewalls of the interlayer insulating film and the phase changeable pattern in the opening.

In further embodiments of the present invention, an etch stop layer is disposed between the interlayer insulating film and the lower electrode.

In still further embodiments of the present invention, a shield layer is disposed on sidewalls of the phase changeable pattern and the upper electrode.

In still further embodiments of the present invention, the phase changeable pattern extends on the interlayer insulating film.

In other embodiments of the present invention, a plate electrode is electrically connected to the upper electrode.

In still other embodiments of the present invention, the upper electrode extends on the interlayer insulating film.

Although described above with respect to device embodiments of the present invention, it will be understood that the present invention may also be embodied as methods of forming a phase changeable memory device.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 6:
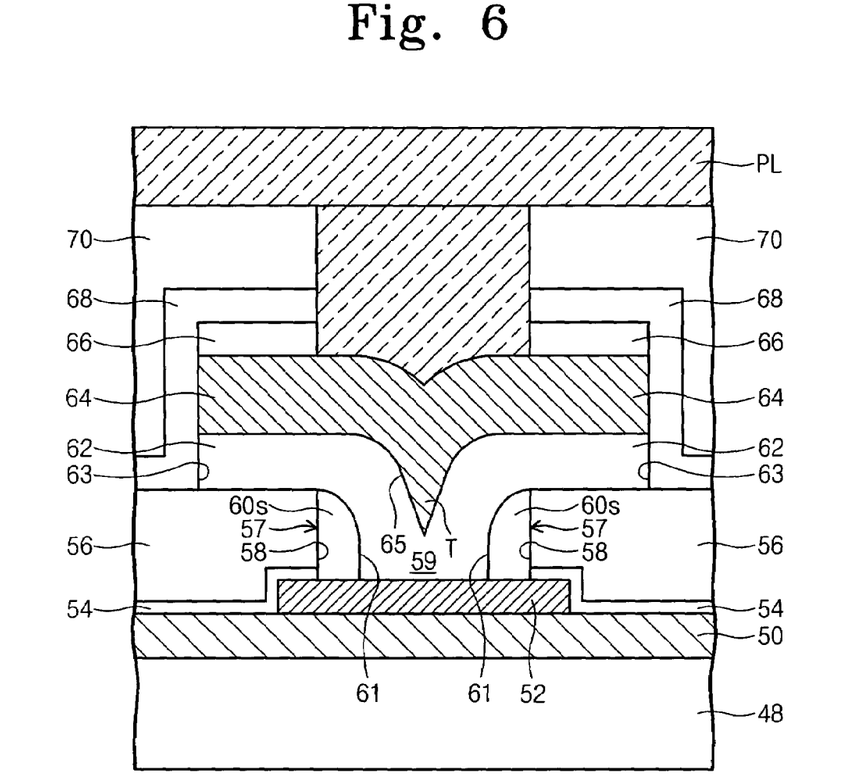
FIG. 6 illustrates a phase changeable memory device according to some embodiments of the present invention.

FIG. 6 illustrates a phase changeable memory device according to some embodiments of the present invention. Referring now to FIG. 6, the phase changeable memory device comprises a lower electrode 52 on a semiconductor substrate 48. The lower electrode 52 is electrically connected to a contact plug 50, which is connected to a source region of an access transistor. In accordance with some embodiments of the present invention, the lower electrode 52 of the phase changeable memory device can have various kinds of plugs connected to a source region of an access transistor. The lower electrode 52 may comprise titanium nitride (TiN) film, titanium aluminum nitride (TiAlN) film, titanium silicon nitride (TiSiN) film, tantalum aluminum nitride (TaAlN) film and/or a tantalum silicon nitride (TaSiN) film. An interlayer insulating film 56 is formed on the semiconductor substrate 48 having the lower electrode 52 disposed thereon. The interlayer insulating film 56 is formed on a sidewall 58 of a contact hole 57 formed on the lower electrode 52. An etch stop layer 54 may be interposed between the interlayer insulating film 56 and the lower electrode 52. A spacer pattern 60s is formed on the sidewall 58 of the contact hole 57. Accordingly, the sidewall 61 of the spacer pattern 60s defines a hollow region 59 on the center of the spacer pattern 60s. A phase changeable pattern 62 and an upper electrode 64 laminated sequentially are disposed on the interlayer insulating film 56. The phase changeable pattern 62 is connected electrically to the lower electrode 52 through the hollow region 59. Because the phase changeable pattern 62 is formed conformally along the sidewall 61 of the spacer pattern 62s, the phase changeable pattern 62 has a dent, depression, or sink 65 directed toward the lower electrode 52 over the lower electrode 52. The dent or sink 65 is filled with an upper electrode 64. Consequently, the upper electrode 64 has a tip T directed toward the lower electrode 52. The upper electrode 64 may comprise titanium nitride (TiN) film, titanium aluminum nitride (TiAlN) film, titanium silicon nitride (TiSiN) film, tantalum aluminum nitride (TaAlN) film and/or tantalum silicon nitride (TaSiN) film. A hard disk pattern 66 may be formed on the upper electrode 64. An upper interlayer insulating film 70 is formed on the semiconductor substrate 48 having the phase changeable pattern 62 and the upper electrode 64 disposed thereon. A shield layer 68 may be interposed between the upper interlayer insulating film 70 and the sidewall 63 of the phase changeable pattern. The shield layer 68 may comprise silicon oxynitride and may reduce the likelihood that the phase changeable pattern 62 degenerates. A plate electrode PL, which is electrically connected to the upper electrode 64, is formed on the upper interlayer insulating film 70.

Figure 7:
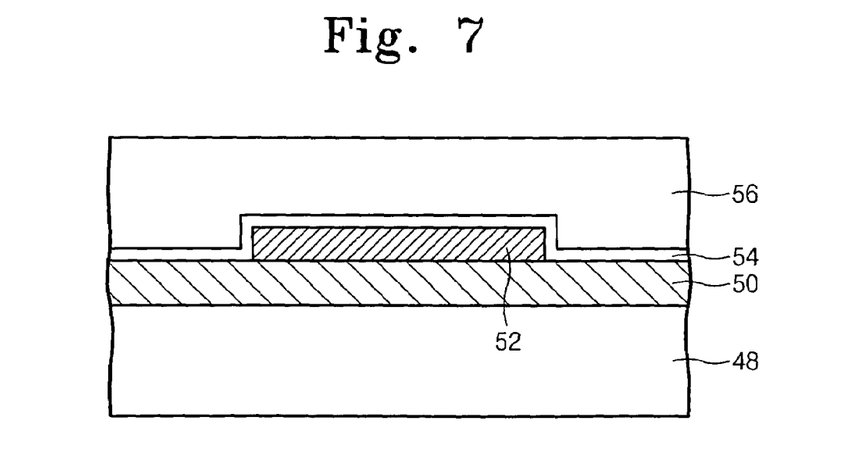
FIGS. 7–10 are cross-sectional views that illustrate methods of fabricating phase changeable memory devices according to some embodiments of the present invention.

FIGS. 7 through 10 are cross-sectional views that illustrate methods of fabricating phase changeable memory devices according to some embodiments of the present invention. Referring now to FIG. 7, a lower electrode 52 is formed on a semiconductor substrate 48. The lower electrode 52 may be disposed on a plug that is connected to a source region of an access transistor. As shown in FIG. 7, the lower electrode 52 may be a planar electrode 52 that is formed on a contact plug 50, which is connected to the source region of an access transistor. The lower electrode 52 may comprise titanium nitride (TiN) film, titanium aluminum nitride (TiAlN) film, titanium silicon nitride (TiSiN) film, tantalum aluminum nitride (TaAlN) film and/or tantalum silicon nitride (TaSiN) film. An interlayer insulating film 56 is formed on the semiconductor substrate 48 having the lower electrode 52 disposed thereon. An etch stop layer 54 may be formed on the semiconductor substrate 48 before forming the interlayer insulating film 56.

Figure 8:
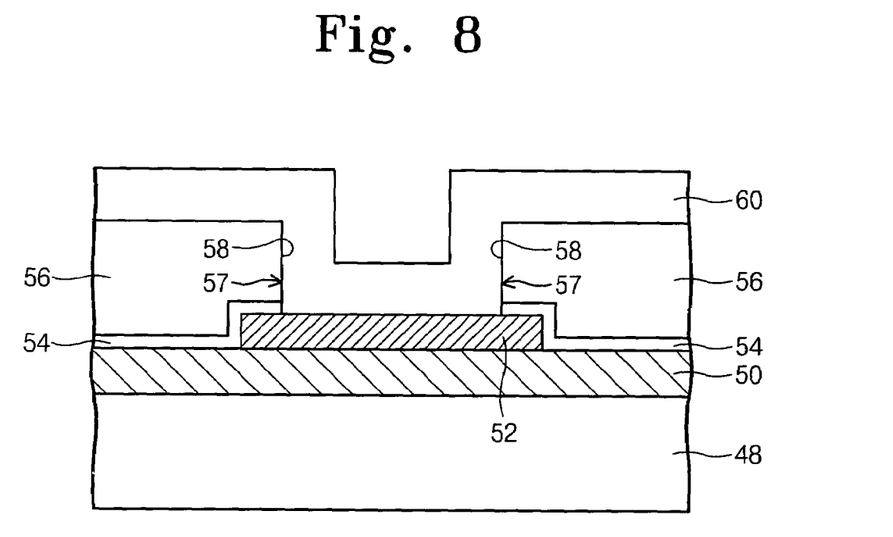

Referring now to FIG. 8, a contact hole having sidewalls 57 is formed by patterning the interlayer insulating film 56. The etch stop layer 54 can prevent the lower electrode 52 from being excessively etched while the interlayer insulating film 56 is etched. After the etch stop layer 54 is formed, the interlayer insulating film 56 is patterned and the etch stop layer 54 is etched sequentially to expose a portion of the lower electrode 52. As shown in FIG. 8, the spacer insulating film 60 is formed to be conformal on the resulting structure.

Figure 9:
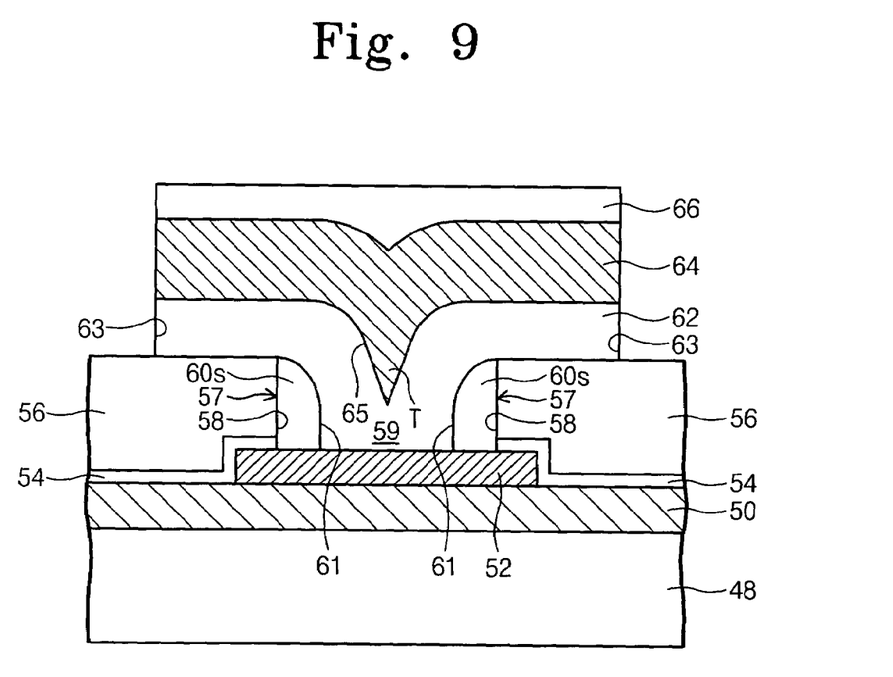

Referring now to FIG. 9, the spacer insulating film 60 is etched anisotropically and a spacer pattern 60s is formed on the sidewall 58 of the contact hole. The sidewall 61 of the spaces pattern 60s defines the hollow region 59 where the lower electrode 52 is exposed. The phase changeable material layer is formed to be conformal on the resulting structure on which the spacer pattern 60s is formed. The phase changeable material layer 62 may be formed by controlling its thickness so that the dent 65 directed toward the lower electrode 52 is formed on the electrode 52. A conductive film 64 is formed on the phase changeable material layer. Consequently, the conductive film 64 fills the dent 65 and has a tip T directed toward the lower electrode 52. The conductive film 64 may comprise titanium nitride (TiN) film, titanium aluminum nitride (TiAlN) film, titanium silicon nitride (TiSiN) film, tantalum aluminum nitride (TaAlN) film and/or tantalum silicon nitride (TaSiN) film. A hard mask film 66 may be further formed on the conductive film 64.

Referring to FIG. 9, the hard mask film 66, the conductive film 64 and the phase changeable material layer 62 are patterned sequentially to form a phase changeable pattern 62, an upper electrode 64 and a hard mask pattern 66 that are laminated sequentially on the lower electrode 52. The phase changeable pattern 62 has a sidewall 63 on the interlayer insulating film 56.

Figure 10:
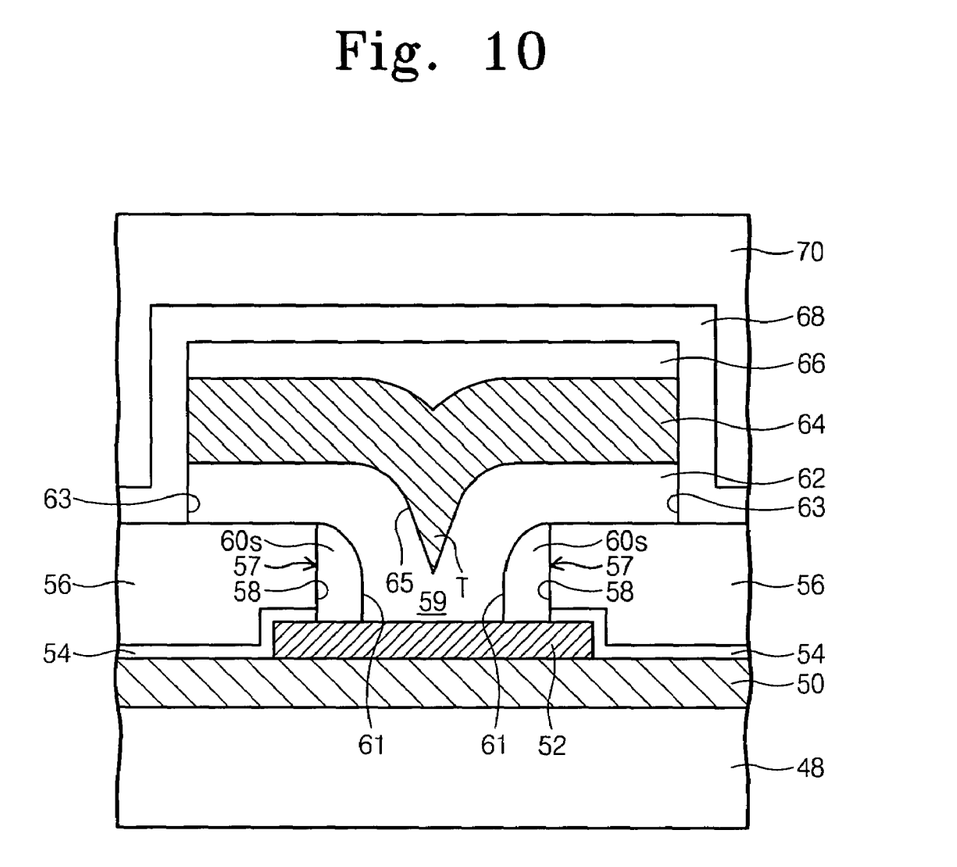

Referring now to FIG. 10, a shield layer 68 is formed to reduce the likelihood that the phase changeable pattern 62 degenerates. An upper interlayer insulating film 70 is formed on the shield layer 68. The shield layer 68 may comprise silicon oxynitride. The upper interlayer insulating film 70 may be formed by laminating a high density plasma oxide film and/or a PETEOS film. A plate electrode PL shown in FIG. 6 may be connected to the upper electrode 64 through the upper interlayer insulating film 70, the shield layer 68, and the hard mask pattern 66.

Figure 11:
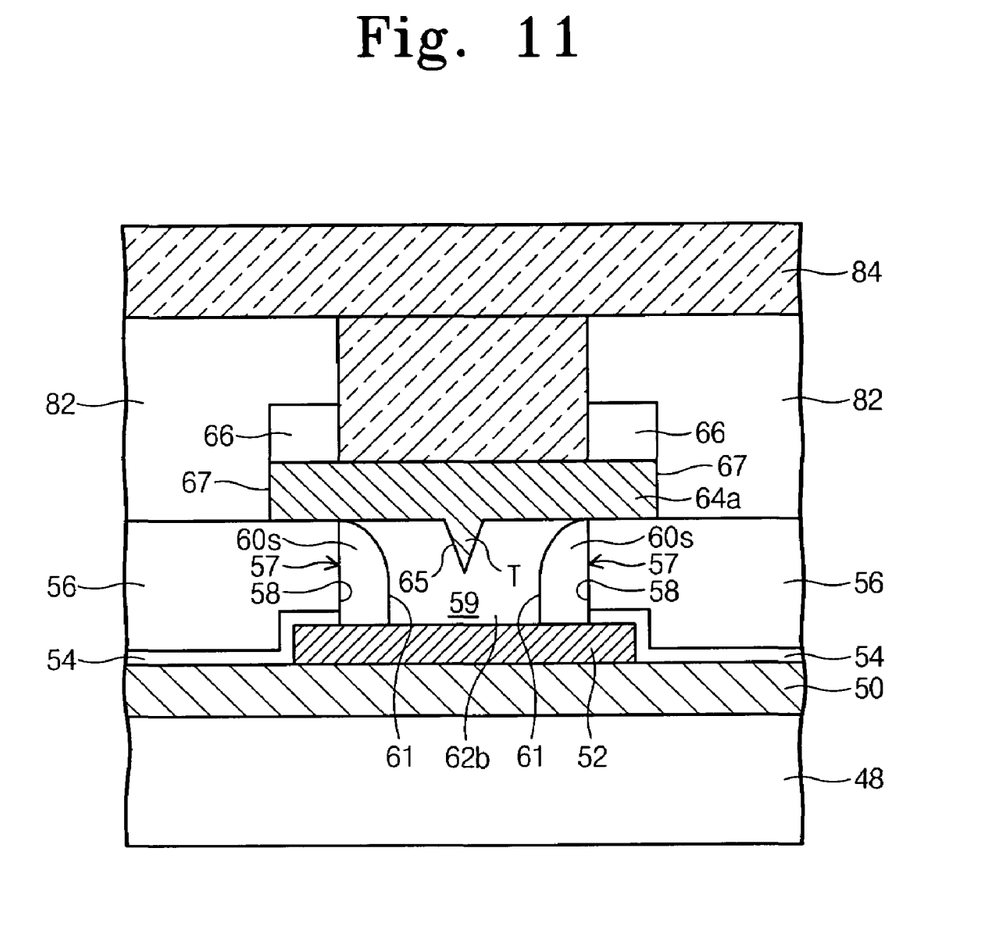
FIGS. 11–14 illustrate methods of fabricating phase changeable memory devices according to other embodiments of the present invention.

FIG. 11 is a cross-sectional view that illustrates methods of fabricating a phase changeable memory device according to some embodiments of the present invention. Referring now to FIG. 11, a phase changeable pattern 62b is buried in a contact hole. As described above, a phase changeable memory device may comprise a lower electrode 52 formed on a semiconductor substrate 48, an etch stop layer 54 formed on the lower electrode 52, an interlayer insulating film 56, a contact hole having a sidewall 58 formed in the interlayer insulating film 56, and a spacer pattern 60s formed on the sidewall 58 of the contact hole. The sidewall 61 of the spacer pattern defines the hollow region 59. A phase changeable material layer fills the hollow region 59 to form a phase changeable pattern 62b. The phase changeable pattern 62b includes a dent 65 that is directed toward the lower electrode 52. The upper electrode 64a is disposed on the phase changeable pattern 62b and the upper electrode 64a has a tip T directed toward the lower electrode 52 on the dent 65. The upper electrode 64a has a sidewall 67 on the interlayer insulating film 56.

The upper interlayer insulating film 82 shown in FIG. 11 is formed on the resulting structure on which the upper electrode 64a is formed. The plate electrode 84 penetrates the upper interlayer insulating film 82 as shown in FIG. 11 to contact the upper electrode 64a. Because the phase changeable pattern 62b is positioned in the hollow region, formation of the shield layer can be omitted.

Figure 12:
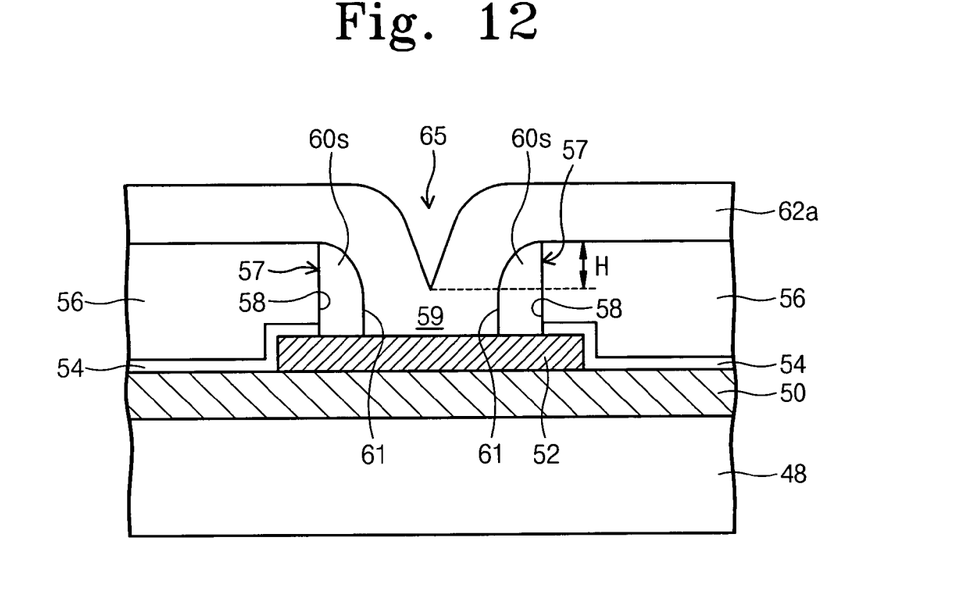
Figure 13:
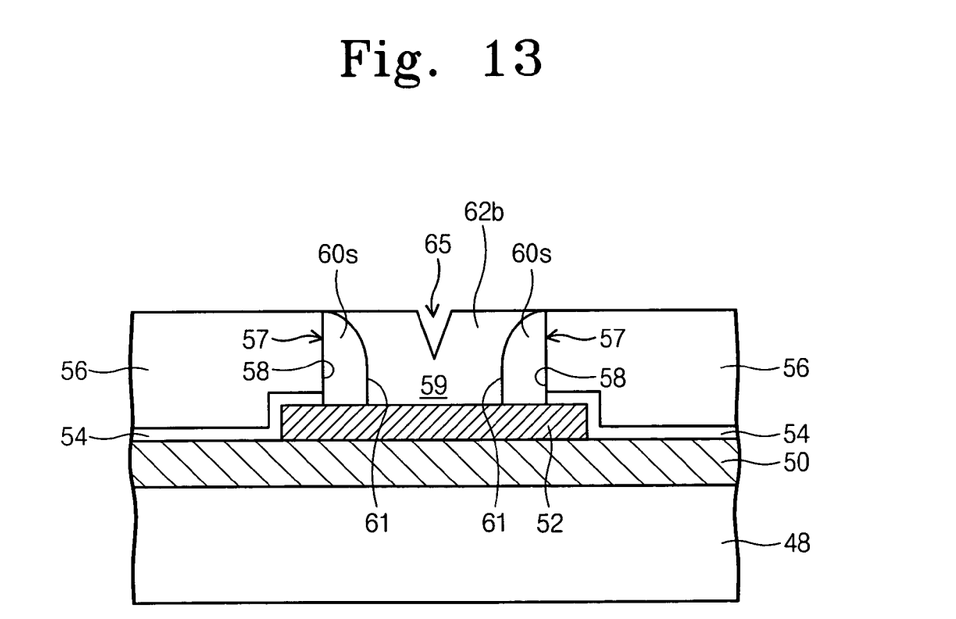
Figure 14:
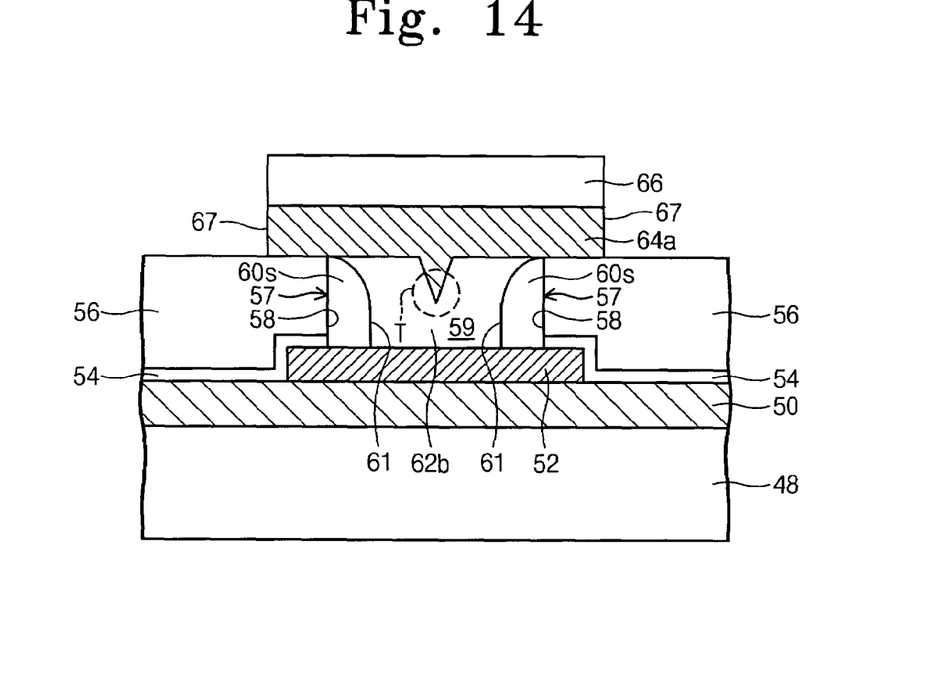

FIGS. 12 through 14 are cross-sectional views that illustrate methods of fabricating phase changeable memory devices according to some embodiments of the present invention. Referring now to FIG. 12, forming a phase changeable device may comprise forming a contact plug 50 and a lower electrode 52 on a semiconductor substrate 48, forming an etch stop layer 54 and an interlayer insulating film 56 on the substrate on which the lower electrode 52 is formed, patterning the interlayer insulating film 56 to form a contact hole on the lower electrode 52, and forming a spacer pattern 60s on a sidewall of the contact hole. The sidewall of the spacer pattern 60s defines a hollow region 59 that exposes the lower electrode 52. A dent 65 may be formed on the lower electrode 52 by controlling the thickness of the phase changeable material layer 62a. The dent 65 is formed so that the lowest point of the dent 65 is lower than the upper surface of the interlayer insulating film 56 by a height H. Even though a polishing process is performed, a lower portion of the dent 65 remains.

Referring now to FIG. 13, the phase changeable material layer 62a may be polished using a chemical mechanical polishing process to expose the upper surface of the interlayer insulating film 56. As a result, a phase changeable pattern 62b is formed in the hollow region 59. The dent 65 of the phase changeable pattern 62b can be polished in the chemical mechanical polishing process, but a lower portion of the dent 65 remains on the phase changeable pattern 62b.

Referring now to FIG. 14, a conductive film is formed on the substrate on which the phase changeable pattern 62b is formed. The conductive film is patterned to form an upper electrode 64a on the phase changeable pattern 62b. The upper electrode 64a has a sidewall 67 on the interlayer insulating film 56. A hard mask film is further formed on the conductive film so that a hard mask pattern 66 may be further formed on the upper electrode 64a.

Thus, according to some embodiments of the present invention, a phase changeable memory device comprises a lower electrode, a phase changeable pattern and an upper electrode. The upper electrode has a tip directed toward the lower electrode.

Figure 15:
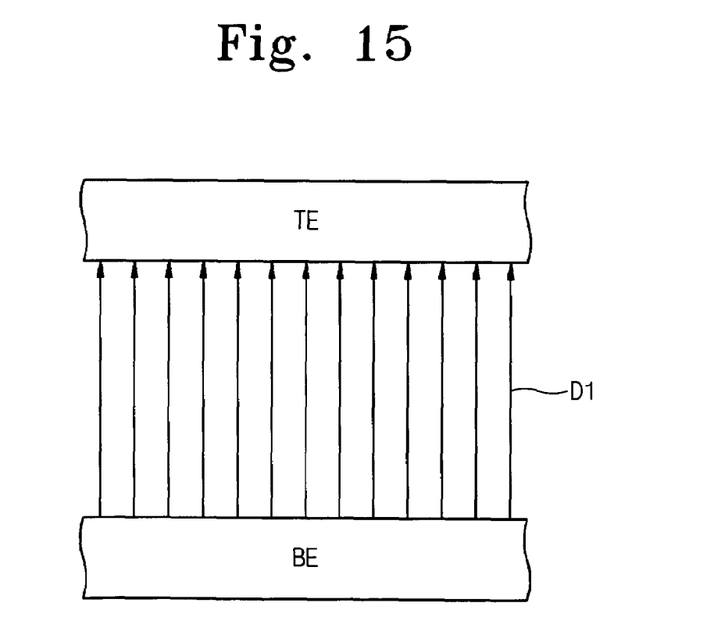
FIGS. 15 and 16 illustrate operations of a conventional phase changeable memory device and phase changeable memory devices according to some embodiments of the present invention, respectively.
Figure 16:
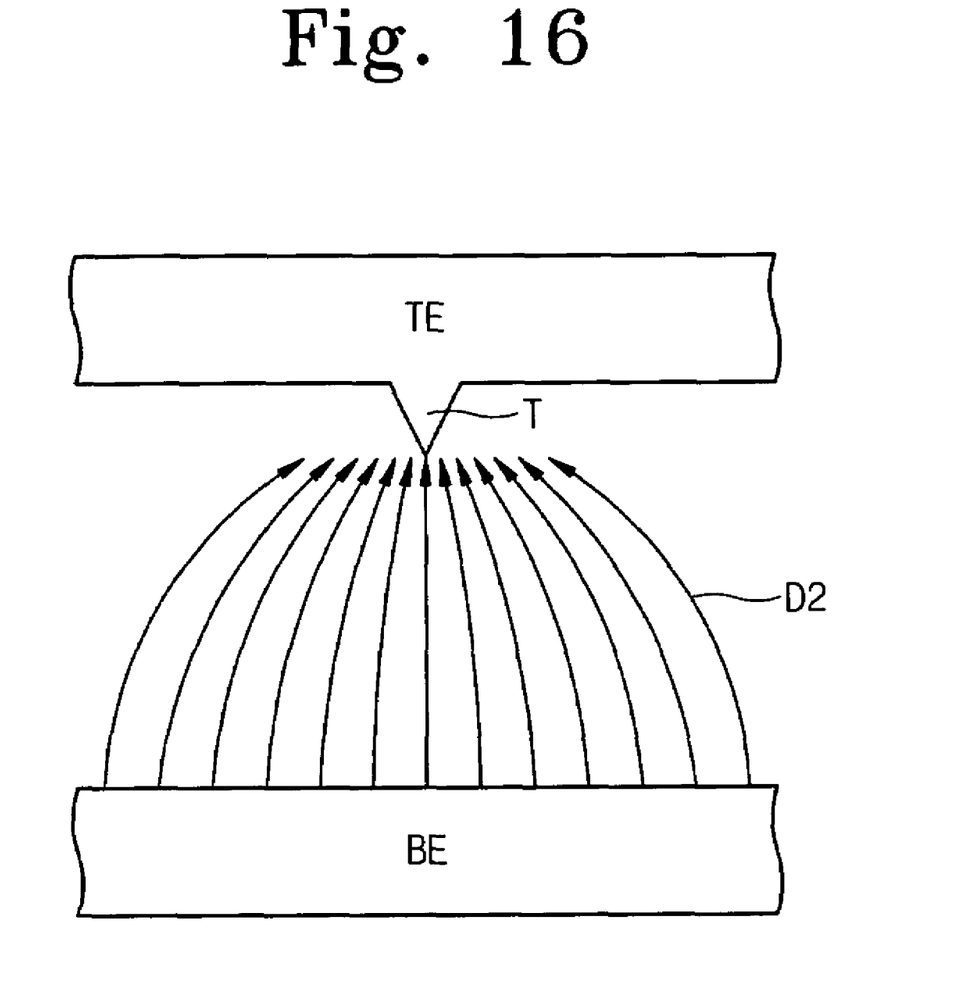

FIGS. 15 and 16 illustrate operations of a conventional phase changeable memory device and phase changeable memory devices according to embodiments of the present invention, respectively. Referring now to FIG. 15, a conventional phase changeable memory device has a lower electrode BE and an upper electrode TE that are planar electrodes and face each other. Accordingly, current density D1 is generally uniform as it travels from the lower electrode BE and the upper electrode TE. As shown in FIG. 16, however, a phase changeable memory device according to some embodiments of the present invention comprises an upper electrode TE having a tip T. Because the current flowing from the lower electrode BE to the upper electrode TE converges at the tip T, the current density D2 flowing to the phase changeable material layer on the lower electrode BE is higher than the current density D1. Consequently, when the same amount of current is applied to the lower electrode, more resistance heat can be generated at the boundary surface of the electrode and the phase changeable material layer and in the phase changeable material layer in phase changeable memory devices according to embodiments of the present invention as compared to conventional phase changeable memory devices because phase changeable memory devices according to embodiments of the present invention have generally higher current density than conventional phase changeable memory devices. Thus, phase changeable memory devices in accordance with some embodiments of the present invention may be more efficient and may consume less power than conventional phase changeable memory devices.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A phase changeable memory device, comprising:
   a substrate;
   a lower electrode disposed on the substrate;
   a phase changeable pattern disposed on the lower electrode;
   an upper electrode disposed on the phase changeable pattern and having a tip that extends therefrom and is directed toward the lower electrode; and
   a shield layer that is disposed on sidewalls of the phase changeable pattern and the upper electrode.

2. The phase changeable memory device of claim 1, further comprising:
   an interlayer insulating film disposed on the substrate having an opening therein that exposes at least a portion of the lower electrode; and
   wherein the phase changeable pattern is formed in the opening and has a depression therein that is directed toward the lower electrode.

3. The phase changeable memory device of claim 2, further comprising:
   spacers disposed between opposing sidewalls of the interlayer insulating film and the phase changeable pattern in the opening.

4. The phase changeable memory device of claim 2, further comprising:
   an etch stop layer disposed between the interlayer insulating film and the lower electrode.

5. A phase changeable memory device, comprising:
   a substrate;
   a lower electrode disposed on the substrate;
   an interlayer insulating film disposed on the substrate having an opening therein that exposes at least a portion of the lower electrode;
   a spacer pattern disposed on sidewalls of the opening;
   a phase changeable pattern disposed on the lower electrode in the opening and extending on the interlayer insulating film;
   an upper electrode disposed on the phase changeable pattern and having a tip that extends therefrom and is directed toward the lower electrode; and
   a shield layer that is disposed on sidewalls of the phase changeable pattern and the upper electrode.

6. The phase changeable memory device of claim 5, wherein the phase changeable pattern has a depression therein that is directed toward the lower electrode.

7. The phase changeable memory device of claim 5, further comprising:
   an etch stop layer disposed between the interlayer insulating film and the lower electrode.

8. The phase changeable memory device of claim 5, further comprising:
   a plate electrode that is electrically connected to the upper electrode.

9. A phase changeable memory device, comprising:
   a substrate;
   a lower electrode disposed on the substrate;
   an interlayer insulating film disposed on the substrate having an opening therein that exposes at least a portion of the lower electrode;
   an etch stop layer disposed between the interlayer insulating film and the lower electrode;
   a spacer pattern disposed on sidewalls of the opening;
   a phase changeable pattern disposed on the lower electrode in the opening; and
   an upper electrode disposed on the phase changeable pattern and extending on the interlayer insulating film, the upper electrode having a tip that extends therefrom and is directed toward the lower electrode.

10. The phase changeable memory device of claim 9, wherein the phase changeable pattern has a depression therein that is directed toward the lower electrode.

11. The phase changeable memory device of claim 9, further comprising:
    a plate electrode that is electrically connected to the upper electrode.

12. A method of forming a phase changeable memory device, comprising:
    providing a substrate;
    forming a lower electrode disposed on the substrate;
    forming a phase changeable pattern on the lower electrode;
    forming an upper electrode on the phase changeable pattern that has a tip that extends therefrom and is directed toward the lower electrode; and
    forming a shield layer on sidewalls of the phase changeable pattern and the upper electrode.

13. The method of claim 12, further comprising:
    forming an interlayer insulating film on the substrate that has an opening therein that exposes at least a portion of the lower electrode; and
    wherein forming the phase changeable pattern comprises forming the phase changeable pattern in the opening so as to have a depression therein that is directed toward the lower electrode.

14. The method of claim 13, further comprising:
    forming spacers between opposing sidewalls of the interlayer insulating film and the phase changeable pattern in the opening.

15. The method of claim 13, further comprising:
    forming an etch stop layer between the interlayer insulating film and the lower electrode.

16. A method of forming a phase changeable memory device, comprising:
providing a substrate;
forming a lower electrode on the substrate;
forming an interlayer insulating film on the substrate that has an opening therein that exposes at least a portion of the lower electrode;
forming a spacer pattern on sidewalls of the opening;
forming a phase changeable pattern on the lower electrode in the opening and extending on the interlayer insulating film;
forming an upper electrode on the phase changeable pattern that has a tip that extends therefrom and is directed toward the lower electrode; and
forming a plate electrode that is electrically connected to the upper electrode.

17. The method of claim 16, wherein the phase changeable pattern has a depression therein that is directed toward the lower electrode.

18. The method of claim 16, further comprising:
forming a shield layer on sidewalls of the phase changeable pattern and the upper electrode.

19. The method of claim 16, further comprising:
forming an etch stop layer between the interlayer insulating film and the lower electrode.

20. A method of forming a phase changeable memory device, comprising:
providing a substrate;
forming a lower electrode on the substrate;
forming an interlayer insulating film on the substrate that has an opening therein that exposes at least a portion of the lower electrode;
forming a spacer pattern on sidewalls of the opening;
forming a phase changeable pattern on the lower electrode in the opening;
forming an upper electrode on the phase changeable pattern and extending on the interlayer insulating film, the upper electrode having a tip that extends therefrom and is directed toward the lower electrode; and
forming a plate electrode that is electrically connected to the upper electrode.

21. The method of claim 20, wherein the phase changeable pattern has a depression therein that is directed toward the lower electrode.

22. The method of claim 20, further comprising:
forming an etch stop layer between the interlayer insulating film and the lower electrode.

23. A method of forming a phase changeable memory device, comprising:
providing a substrate;
forming a lower electrode on the substrate;
forming an etch stop layer on the substrate and the lower electrode;
forming an interlayer insulating film on the etch stop layer, lower electrode and the substrate;
patterning the interlayer insulating film to form a contact hole that exposes at least a portion of the lower electrode;
forming a spacer pattern on sidewalls of the contact hole;
forming a phase changeable material layer in the contact hole on the lower electrode, the phase changeable material layer having a depression therein that is directed toward the lower electrode;
forming a conductive film on the phase changeable material layer; and
patterning the conductive film and the phase changeable material layer to form an upper electrode and a phase changeable pattern, respectively.

24. The method of claim 23, wherein patterning the interlayer insulating film comprises:
patterning the interlayer insulating film to expose the etch stop layer on a portion of the lower electrode; and
etching the exposed etch stop layer to expose the lower electrode.

25. The method of claim 23, wherein the phase changeable material layer is thicker than half of a minimum width of a lower portion of the contact hole.

26. The method of claim 23, wherein the conductive film fills the depression of the phase changeable material layer to form a tip directed toward the lower electrode.

27. The method of claim 23, further comprising:
forming an upper interlayer insulating film on the upper electrode;
patterning the upper interlayer insulating film to expose a portion of the upper electrode; and
forming a plate electrode on the upper interlayer insulating film that is connected to the exposed portion of the upper electrode.

28. The method of claim 27, further comprising forming a shield layer on the upper electrode and sidewalls of the phase changeable pattern prior to forming the upper interlayer insulating film.

29. A method of forming a phase changeable memory device, comprising:
providing a substrate;
forming a lower electrode on the substrate;
forming an etch stop layer on the substrate and the lower electrode;
forming an interlayer insulating film on the etch stop layer, lower electrode and the substrate;
patterning the interlayer insulating film to form a contact hole that exposes at least a portion of the lower electrode;
forming a spacer pattern on sidewalls of the contact hole;
forming a phase changeable pattern in the contact hole on the lower electrode, the phase changeable pattern having a depression therein that is directed toward the lower electrode;
forming a conductive film on the phase changeable material layer; and
patterning the conductive film to form an upper electrode.

30. The method of claim 29, wherein patterning the interlayer insulating film comprises:
patterning the interlayer insulating film to expose the etch stop layer on a portion of the lower electrode; and
etching the exposed etch stop layer to expose the lower electrode.

31. The method of claim 29, wherein forming the phase changeable pattern comprises:
forming a phase changeable material layer in the contact hole on the lower electrode, the phase changeable material layer having a depression therein that is directed toward the lower electrode such that a deepest point of the depression is located below an upper surface of the interlayer insulating film; and chemical mechanical polishing the phase changeable material layer to expose the interlayer insulating film to form the phase changeable pattern.

32. The method of claim 29, wherein the conductive film fills the depression of the phase changeable material layer to form a tip directed toward the lower electrode.

33. The method of claim 29, further comprising:

forming an upper interlayer insulating film on the upper electrode;

patterning the upper interlayer insulating film to expose a portion of the upper electrode; and forming a plate electrode on the upper interlayer insulating film that is connected to the exposed portion of the upper electrode.

34. The method of claim 33, further comprising forming a shield layer on the upper electrode and sidewalls of the phase changeable pattern prior to forming the upper interlayer insulating film.

* * * * *